United States Patent
Hsu et al.

(10) Patent No.: US 8,338,938 B2
(45) Date of Patent: Dec. 25, 2012

(54) CHIP PACKAGE DEVICE AND MANUFACTURING METHOD THEREOF

(75) Inventors: Han Cheng Hsu, Tainan County (TW); Ting Chang Yeh, Tainan County (TW)

(73) Assignee: Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 13/104,640

(22) Filed: May 10, 2011

(65) Prior Publication Data

US 2011/0278714 A1 Nov. 17, 2011

(30) Foreign Application Priority Data

May 14, 2010 (TW) ................................ 99115394 A

(51) Int. Cl.
*H01L 23/48* (2006.01)

(52) U.S. Cl. ............ 257/692; 257/E21.506; 257/E23.01; 438/106; 438/107; 438/108; 438/123

(58) Field of Classification Search .................. 257/692, 257/E21.506, E23.01
See application file for complete search history.

(56) References Cited

U.S. PATENT DOCUMENTS

| | | | |
|---|---|---|---|
| 5,105,259 A * | 4/1992 | McShane et al. ............. | 257/667 |
| 5,807,768 A * | 9/1998 | Shin ............................. | 438/127 |
| 5,835,355 A * | 11/1998 | Dordi ........................... | 361/760 |
| 5,940,271 A * | 8/1999 | Mertol ......................... | 361/704 |
| 5,977,626 A * | 11/1999 | Wang et al. .................. | 257/707 |
| 6,222,263 B1 * | 4/2001 | Sherif et al. ................. | 257/704 |
| 6,236,568 B1 * | 5/2001 | Lai et al. ..................... | 361/704 |
| 6,265,771 B1 * | 7/2001 | Ference et al. ............... | 257/706 |
| 6,274,927 B1 * | 8/2001 | Glenn ........................... | 257/680 |
| 6,278,182 B1 * | 8/2001 | Liu et al. ..................... | 257/712 |
| 6,286,207 B1 * | 9/2001 | Oura et al. ................... | 29/846 |
| 6,323,066 B2 * | 11/2001 | Lai et al. ..................... | 438/122 |
| 6,407,461 B1 * | 6/2002 | Farquhar et al. ............. | 257/787 |
| 6,433,420 B1 * | 8/2002 | Yang et al. .................. | 257/712 |
| 6,458,626 B1 * | 10/2002 | Huang et al. ................. | 438/112 |
| 6,507,104 B2 * | 1/2003 | Ho et al. ...................... | 257/712 |
| 6,654,248 B1 * | 11/2003 | Fishley et al. ............... | 361/704 |
| 6,716,676 B2 * | 4/2004 | Chen et al. .................. | 438/122 |
| 6,734,552 B2 * | 5/2004 | Combs et al. ................. | 257/707 |
| 6,833,287 B1 * | 12/2004 | Hur et al. ..................... | 438/107 |
| 6,858,931 B2 * | 2/2005 | Huang et al. ................. | 257/707 |
| 6,894,229 B1 * | 5/2005 | Cheah .......................... | 174/255 |
| 7,015,072 B2 * | 3/2006 | Combs et al. ................. | 438/122 |
| 7,126,218 B1 * | 10/2006 | Darveaux et al. ............ | 257/706 |
| 7,135,782 B2 * | 11/2006 | Nishikawa ................... | 257/796 |
| 7,141,886 B2 * | 11/2006 | Dimaano et al. ............. | 257/796 |
| 7,196,415 B2 * | 3/2007 | Zhong et al. ................. | 257/712 |

(Continued)

*Primary Examiner* — N Drew Richards
*Assistant Examiner* — Ankush Singal
(74) *Attorney, Agent, or Firm* — WPAT, P.C.; Anthony King

(57) ABSTRACT

A chip package device includes a substrate having a chip bonding area and at least one contact pad, a chip having an active surface and an inactive surface, at least one wire, an adhesive layer, a heat dissipation element, and an encapsulation. The chip is disposed on the chip bonding area with its inactive surface facing the substrate. The chip includes at least one bonding pad disposed on the active surface. The wire correspondingly connects the at least one bonding pad and the at least one contact pad. The adhesive layer covers the active surface of the chip and encloses a portion of the wire extending over the bonding pad. The heat dissipation element is attached to the adhesive layer and covers the chip. The encapsulation partially encloses the periphery of the assembly including the chip, the adhesive and the heat dissipation element, and has an indented opening to expose the surface of the heat dissipation element.

17 Claims, 10 Drawing Sheets

U.S. PATENT DOCUMENTS

| | | | |
|---|---|---|---|
| 7,315,080 B1* | 1/2008 | Fan et al. | 257/717 |
| 7,745,262 B2* | 6/2010 | Huang et al. | 438/122 |
| 7,952,194 B2* | 5/2011 | Nair et al. | 257/723 |
| 7,994,620 B2* | 8/2011 | Yoshimura et al. | 257/686 |
| 8,008,763 B2* | 8/2011 | Yoshimura et al. | 257/686 |
| 8,017,449 B2* | 9/2011 | Cheng et al. | 438/126 |
| 8,018,072 B1* | 9/2011 | Miks et al. | 257/777 |
| 8,030,134 B2* | 10/2011 | Kwon et al. | 438/109 |
| 8,072,083 B1* | 12/2011 | St. Amand et al. | 257/777 |
| 2001/0050428 A1* | 12/2001 | Ando et al. | 257/700 |
| 2002/0074649 A1* | 6/2002 | Chrysler et al. | 257/720 |
| 2002/0084524 A1* | 7/2002 | Roh et al. | 257/738 |
| 2004/0046241 A1* | 3/2004 | Combs et al. | 257/678 |
| 2004/0100832 A1* | 5/2004 | Nakajima | 365/200 |
| 2004/0212080 A1* | 10/2004 | Chen et al. | 257/712 |
| 2005/0087864 A1* | 4/2005 | Yang et al. | 257/720 |
| 2005/0095875 A1* | 5/2005 | Huang et al. | 438/800 |
| 2005/0224959 A1* | 10/2005 | Kwon et al. | 257/723 |
| 2007/0029683 A1* | 2/2007 | Tsai et al. | 257/796 |
| 2007/0045835 A1* | 3/2007 | Lin et al. | 257/734 |
| 2008/0308914 A1* | 12/2008 | Shen et al. | 257/668 |
| 2008/0308915 A1* | 12/2008 | Shen et al. | 257/668 |
| 2009/0001599 A1* | 1/2009 | Foong et al. | 257/777 |
| 2009/0014745 A1* | 1/2009 | Wang et al. | 257/98 |
| 2009/0243086 A1* | 10/2009 | Warren | 257/712 |
| 2009/0267222 A1* | 10/2009 | Zhong et al. | 257/707 |
| 2010/0067224 A1* | 3/2010 | Wu | 362/235 |
| 2010/0261314 A1* | 10/2010 | Takamoto et al. | 438/114 |

* cited by examiner

CHIP PACKAGE DEVICE AND MANUFACTURING METHOD THEREOF

BACKGROUND OF THE INVENTION

1. Field of the Invention

The present invention relates to a chip package device and a manufacturing method thereof.

2. Description of the Related Art

Generally, semiconductor packaging refers to the use of an encapsulant to enclose a semiconductor chip with provision of electrical connections outside the encapsulant for connecting an external device or circuit. In current semiconductor packaging methods, the ball grid array package (BGA) technology is most commonly used for packaging high density and high pin count chips. In a conventional BGA package, a semiconductor chip is placed on a printed circuit board and wire-bonded to the printed circuit board. An encapsulant is employed to enclose the semiconductor chip and wires. Solder balls are formed on the back of the printed circuit board to electrically connect an external device and the semiconductor chip.

While the circuit of the semiconductor chip is under operation, the semiconductor chip generates heat. In a conventional BGA package, the semiconductor chip is encapsulated by an encapsulant having poor thermal conductivity. Consequently, the heat from the semiconductor chip cannot be easily dissipated.

Some BGA packages have heat sinks in the encapsulant for facilitating the heat dissipation of semiconductor chips. However, because the encapsulant has poor thermal conductivity and the heat sinks are enclosed by the encapsulant, the heat dissipation efficiency of the BGA packages is limited.

U.S. Pat. No. 6,458,626 discloses a semiconductor package having a heat sink module plate exposed externally for increasing the heat dissipation efficiency of the package. The semiconductor package is fabricated by completely enclosing an interface layer/heat sink module plate combination and semiconductor chips in encapsulant and cutting the encapsulated body. After cutting, the encapsulant above the heat sink module plate is removed by separating the interface layer from the heat sink module plate such that the heat sink module plate can be exposed externally. However, the method of the patent is complex. In addition, during the process of cutting the encapsulated body, cutting tools will cut the heat sink module plate, which is made of metal, resulting in the wear of the cutting tools. Further, the metal heat sink module plate cannot be cut neatly and smoothly, causing poor production quality. Moreover, during the encapsulation process, the encapsulant completely encloses the interface layer/heat sink module plate combination. The interface layer may be tightly adhered to the heat sink module plate by the pressure in the encapsulation process, resulting in difficult removal of the interface layer and the above encapsulant.

In view of the drawbacks of the heat dissipating designs of present semiconductor packages, a new heat dissipating design is needed.

SUMMARY OF THE INVENTION

One objective of the present invention is to provide a chip package device and a manufacturing method thereof. The chip package device includes a heat dissipation element, which sufficiently exposes the chip package device so that the chip package device has good heat dissipation efficiency. The method proposed by the present invention allows the manufacture of a chip package device having an exposed heat dissipation element without cutting the enclosed heat dissipation element. The method is simple and has high production yield.

In accordance with the above objectives, the present invention proposes a chip package device comprising a substrate, a chip, at least one wire, an adhesive layer, a heat dissipation element, and an encapsulation. The substrate includes at least one chip bonding area and at least one contact pad disposed peripherally about the at least one chip bonding area. The chip includes an active surface, an inactive surface, and at least one bonding pad disposed on the active surface. The chip is disposed on the at least one chip bonding area of the substrate with its inactive surface facing the substrate. The at least one wire connects the at least one bonding pad and the at least one contact pad. The adhesive layer covers the active surface of the chip and encloses a portion of the at least one wire extending over the at least one bonding pad. The heat dissipation element is attached to the adhesive layer and covers the chip. The encapsulation partially encloses a periphery of an assembly including the chip, the adhesive layer, and the heat dissipation element, and includes an indented opening to expose a surface of the heat dissipation element.

The present invention proposes a manufacturing method of a chip package device. The method comprises the steps of providing a substrate including at least one bonding area and at least one contact pad, providing at least one chip including an active surface, an inactive surface, and at least one bonding pad, wherein the at least one chip is disposed on the at least one chip bonding area of the substrate with its inactive surface facing the substrate, connecting the at least one bonding pad and the at least one contact pad using at least one wire, applying an adhesive layer to cover the active surface of the at least one chip and enclosing a portion of the wire extending over the at least one bonding pad, attaching a heat dissipation assembly, including a heat dissipation element and a cover element, to the adhesive layer, wherein the heat dissipation element is between the cover element and the at least one chip, forming an encapsulation to enclose a periphery of an assembly including the chip, the adhesive layer, and the heat dissipation element, the encapsulation including a top exposing the cover element, and removing the cover element.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

Figure 1:
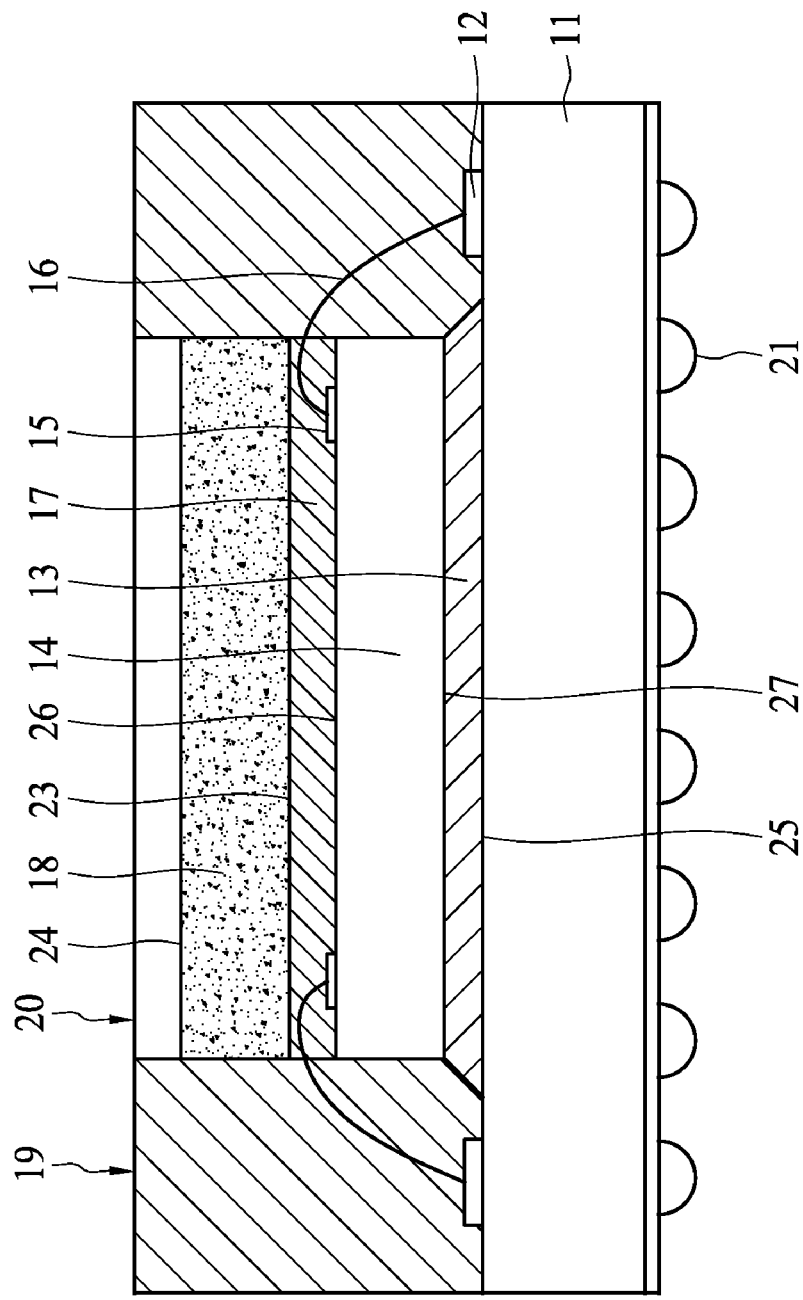
FIG. 1 is a sectional view showing a chip package device according to one embodiment of the present invention.

FIG. 1 is a sectional view showing a chip package device 1 according to one embodiment of the present invention. Referring to FIG. 1, the chip package device 1 comprises a substrate 11, a chip 14, at least one wire 16, an adhesive layer 17, a heat dissipation element 18, and an encapsulation 19. The chip 14 is disposed on the substrate 11. The adhesive layer 17 is disposed on the chip 14. The heat dissipation element 18 is disposed on the adhesive layer 17. The at least one wire 16 electrically connects the chip 14 and the substrate 11, and is enclosed partially by the adhesive layer 17. The encapsulation 19 partially encloses the periphery of the stacked structure including the chip 14, the adhesive layer 17 and the heat dissipation element 18, and exposes a surface 24 of the heat dissipation element 18.

In the present embodiment, the at least one wire 16 includes two end portions, and one end portion is in the encapsulation 19 and another end portion is in the adhesive layer 17.

As described in detail below, the substrate 11 includes at least one chip bonding area 25 and at least one contact pad 12, which may be disposed peripherally about the at least one chip bonding area 25. In one embodiment, the substrate 11 comprises a plurality of contact pad 12, which are disposed peripherally about or along the periphery of the at least one chip bonding area 25. The substrate 11 can be a printed circuit board or an FR4 or FR5 fiberglass reinforced epoxy resin substrate, a BT (bismaleimide triazine) substrate, or the like.

The chip 14 comprises at least one bonding pad 15, an active surface 26, and an inactive surface 27, in which the at least one bonding pad 15 is on the active surface 26. The chip 14 is attached to at least one corresponding chip bonding area 25 of the substrate 11 using an adhesive 13 in a manner such that the inactive surface 27 of the chip 14 faces toward the substrate 11. The adhesive 13 may comprise epoxy resin, silver paste, or B-stage resin.

The at least one bonding pad 15 of the chip 14 and a corresponding contact pad 12 on the substrate 11 are electrically connected using a wire 16.

The adhesive layer 17 covers the active surface 26 of the chip 14, enclosing a portion of the at least one wire 16 extending over the corresponding bonding pad 15. In one embodiment, the adhesive layer 17 comprises film over wire (FOW) material.

The heat dissipation element 18 is attached to the adhesive layer 17 and covers the chip 14. In the present embodiment, the major surface area of the heat dissipation element 18 is substantially equal to the major surface area of the chip 14. In addition, the heat dissipation element 18 can be made of metal or silicon. Furthermore, the heat dissipation element 18 includes a surface 23 attached to the adhesive layer 17 and another surface 24 opposite the surface 23, wherein the surface 23 can be rougher than the surface 24 such that a stronger adhesion can occur between the heat dissipation element 18 and the adhesive layer 17.

The encapsulation 19 can be formed to partially enclose the periphery of the stacked assembly including the chip 14, the adhesive layer 17, and the heat dissipation element 18. An indented opening 20 is formed on the encapsulation 19, exposing the entire surface 24 of the heat dissipation element 18. In other words, the indented opening 20 of the encapsulation 19 has at least a dimension equal to that of the heat dissipation element 18.

A plurality of solder balls 21 can further be formed on the substrate 11. The plurality of solder balls 21 and the chip 14 can be disposed oppositely. Through the plurality of solder balls 21, the chip 14 can electrically connect to a device or circuit outside the chip package device 1.

Figure 2:
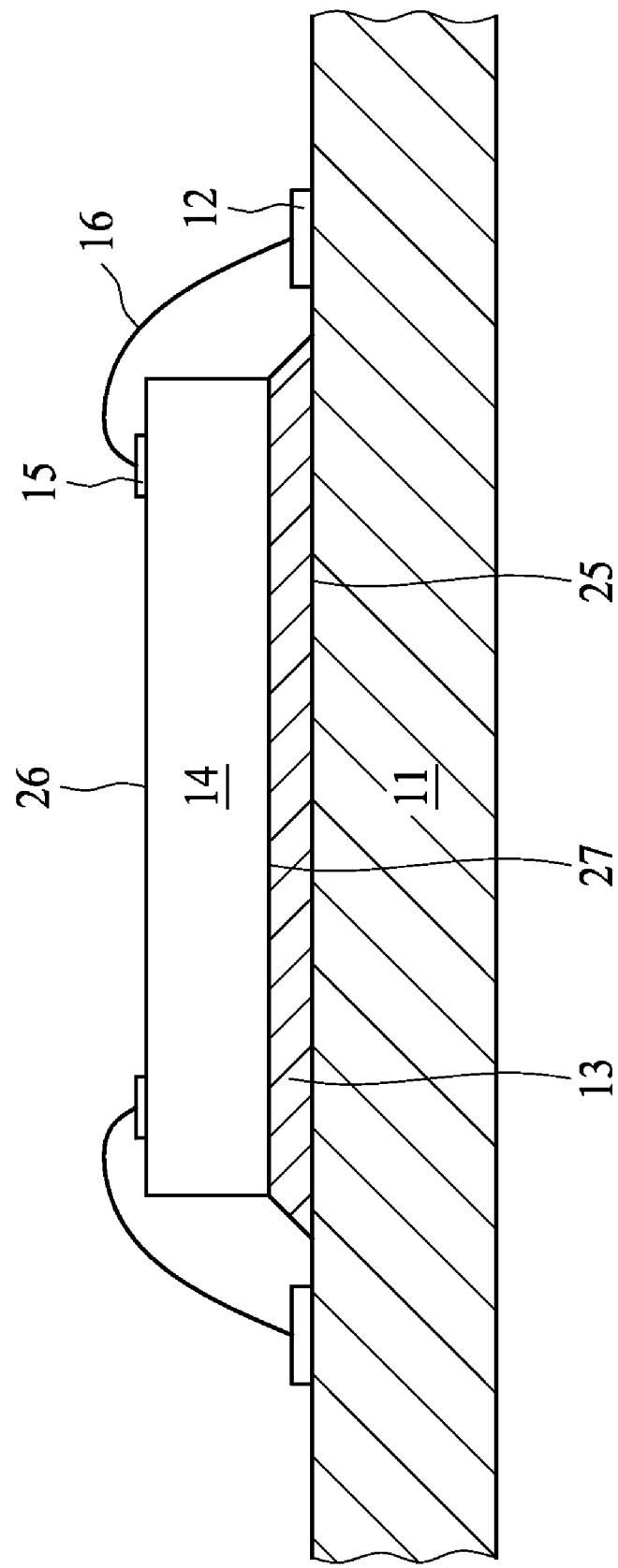
FIGS. 2 through 6 are sectional views showing the processes of the manufacturing method of a chip package device according to one embodiment of the present invention.

FIGS. 2 through 6 are sectional views showing the processes of the manufacturing method of a chip package device 1 according to one embodiment of the present invention. Referring to FIG. 2, the manufacturing method of a chip package device 1 initially provides a substrate 11. The substrate 11 comprises at least one chip bonding area 25 and at least one contact pad 12 disposed peripherally about the at least one chip bonding area 25. Thereafter, at least one chip 14 is provided. The at least one chip 14 may comprise an active surface 26, an inactive surface 27, and at least one bonding pad 15 disposed on the active surface 26. Next, the chip 14 is arranged with its inactive surface 27 facing the substrate 11 and attached to the corresponding one of the at least one chip bonding area 25 of the substrate 11 with an adhesive 13. Furthermore, a wire 16 is employed to connect the corresponding bonding pad 15 of the chip 14 and the corresponding contact pad 12 on the substrate 11.

Figure 3:
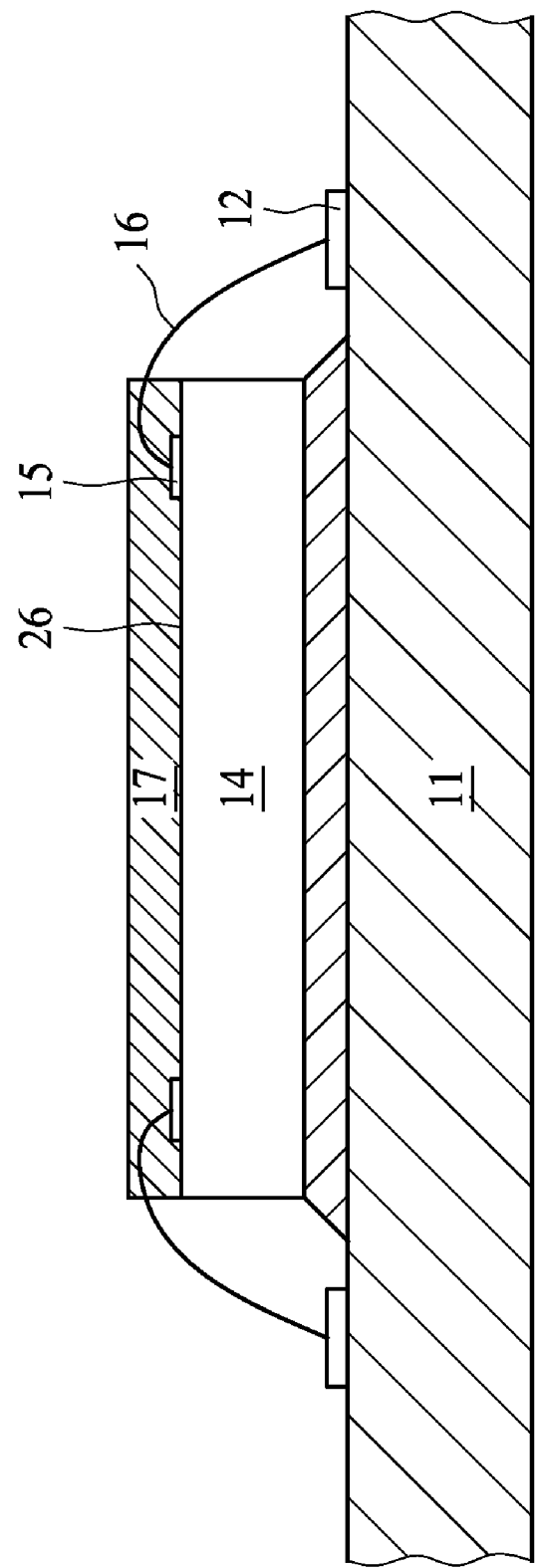

Referring to FIG. 3, an adhesive layer 17 is applied to cover the active surface 26 of the chip 14 and to partially enclose a portion of the at least one wire 16 extending over the corresponding at least one bonding pad 15.

Figure 4:
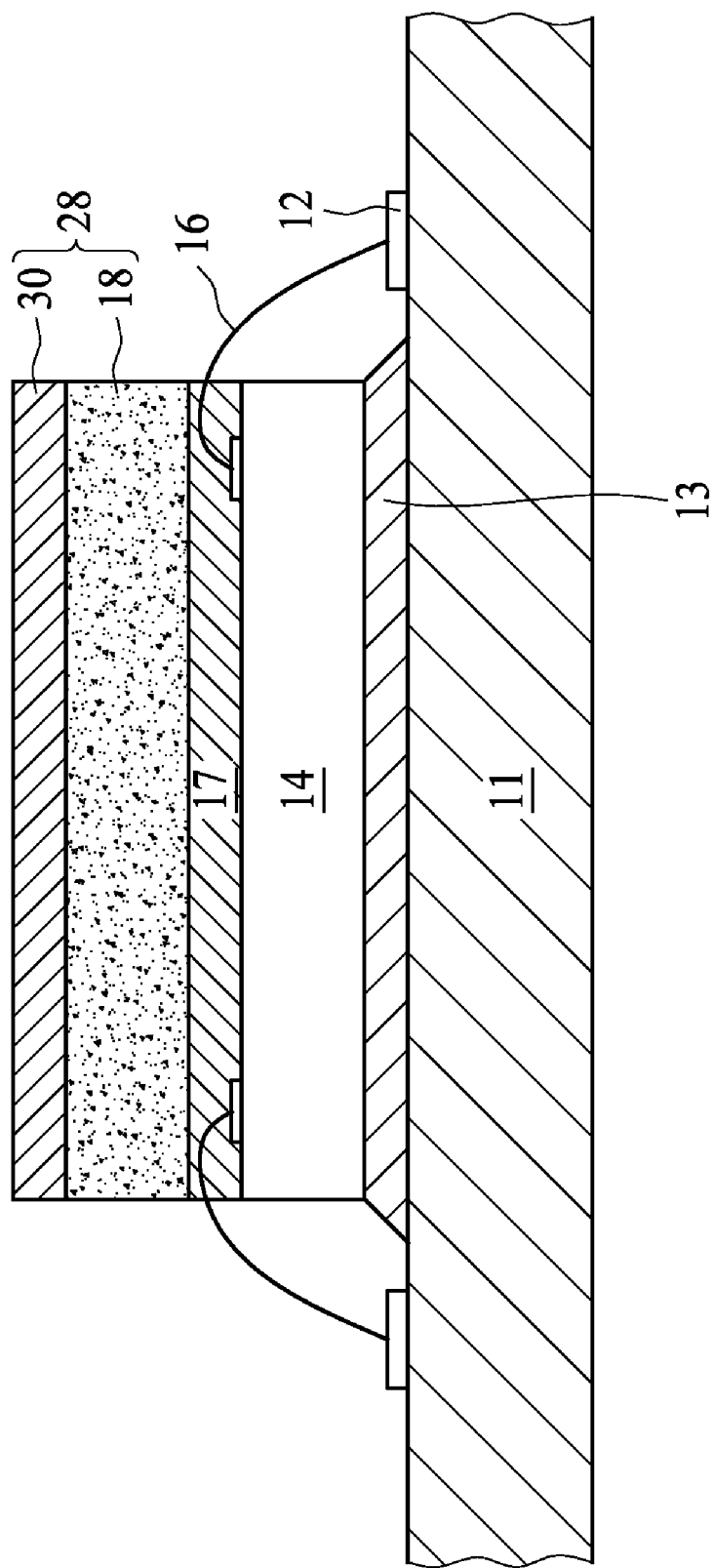

As shown in FIG. 4, a heat dissipation assembly 28 is attached to the adhesive layer 17. The heat dissipation assembly 28 comprises a heat dissipation element 18 and a cover element 30. In one embodiment, the heat dissipation element 18, the adhesive layer 17, the cover element 30, and the chip 14 can be equivalent in surface area.

Figure 5:
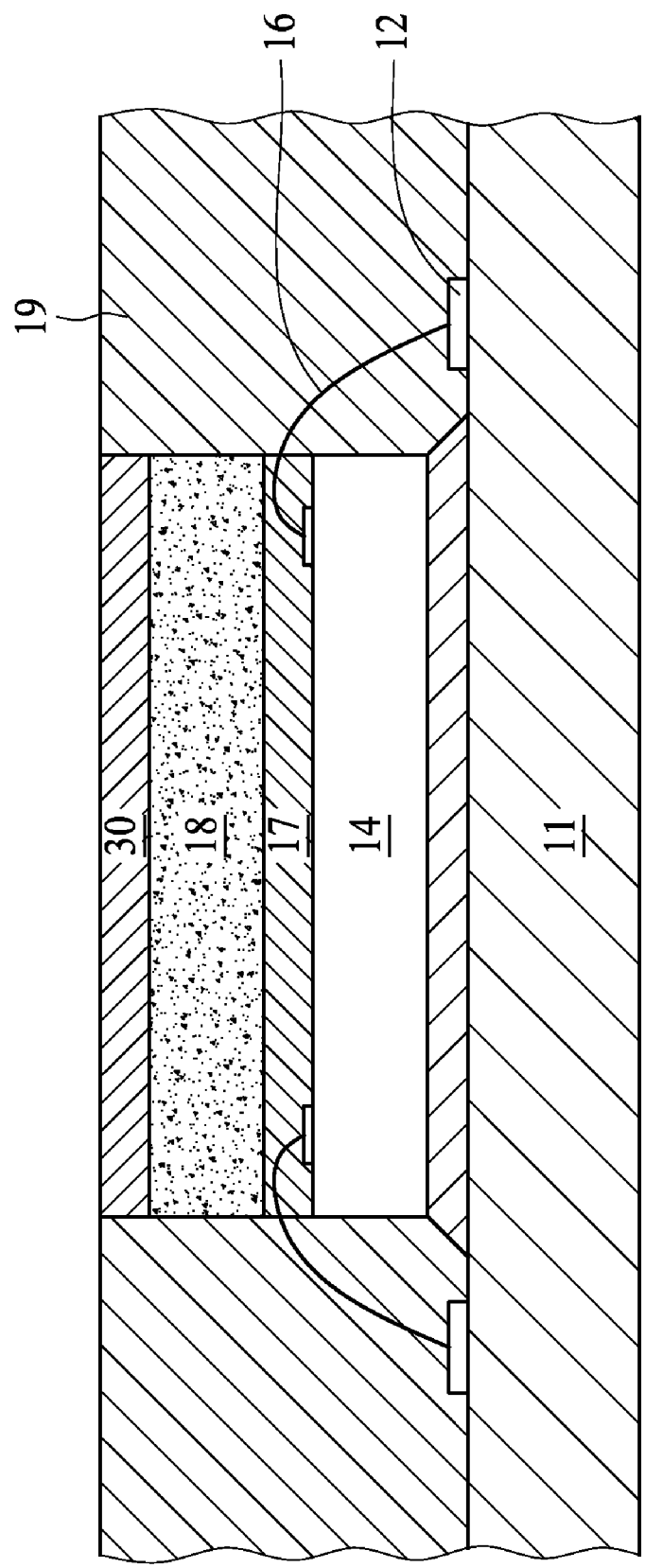

Referring to FIG. 5, an encapsulation 19 is formed to enclose the periphery of the assembly including the chip 14, the adhesive layer 17, and the heat dissipation assembly 28, with the top of the encapsulation 19 exposing the cover element 30.

Figure 6:
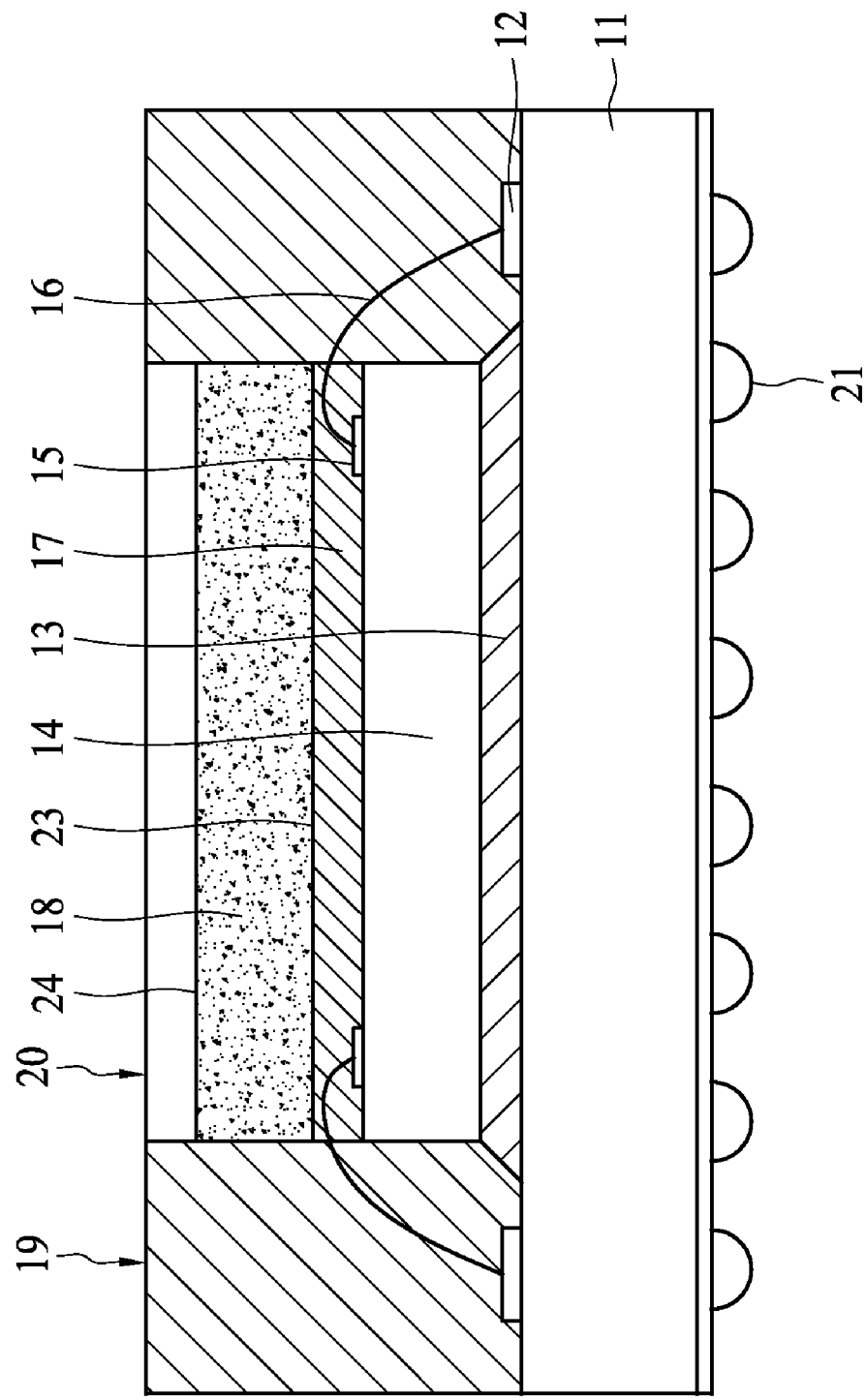

As illustrated in FIG. 6, after cutting, a plurality of independent chip package devices 1 having top portions capped with cover elements 30 are obtained. Finally, the cover elements 30 are removed.

The cover element 30 can be a film that can withstand the high temperature for forming the encapsulation 19. The cover element 30 can be a thermal release film, and the cover element 30 can be removed by heating. In addition, the cover element 30 can be a peelable film that can be peeled off directly from the heat dissipation element 18.

Figure 7:
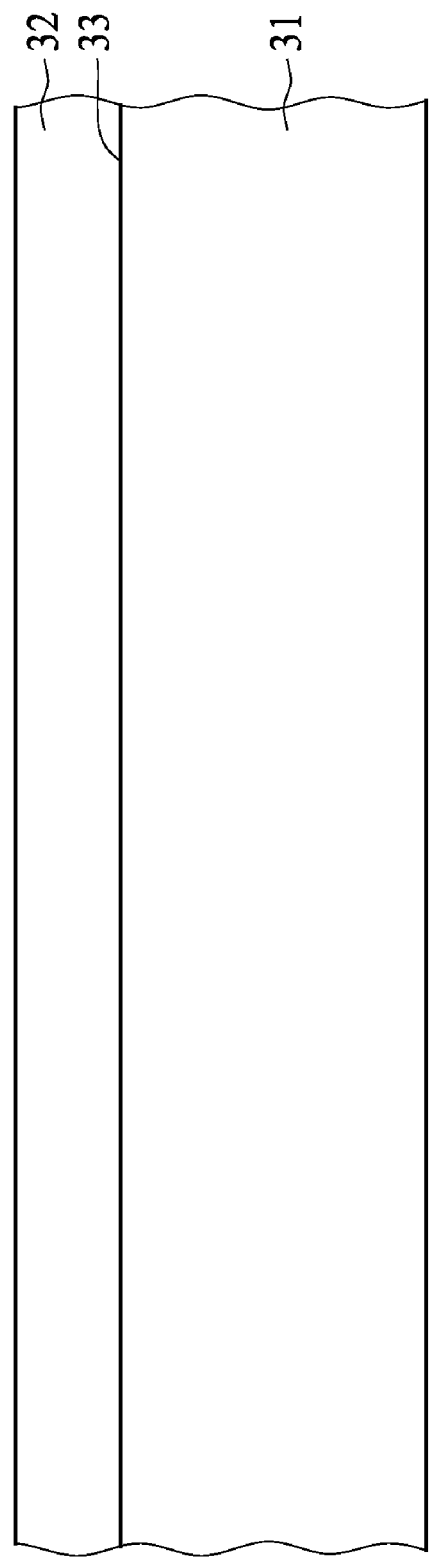
FIGS. 7 to 9 are sectional views showing the processes of a method for manufacturing heat dissipation assemblies according to one embodiment of the present invention.
Figure 8:
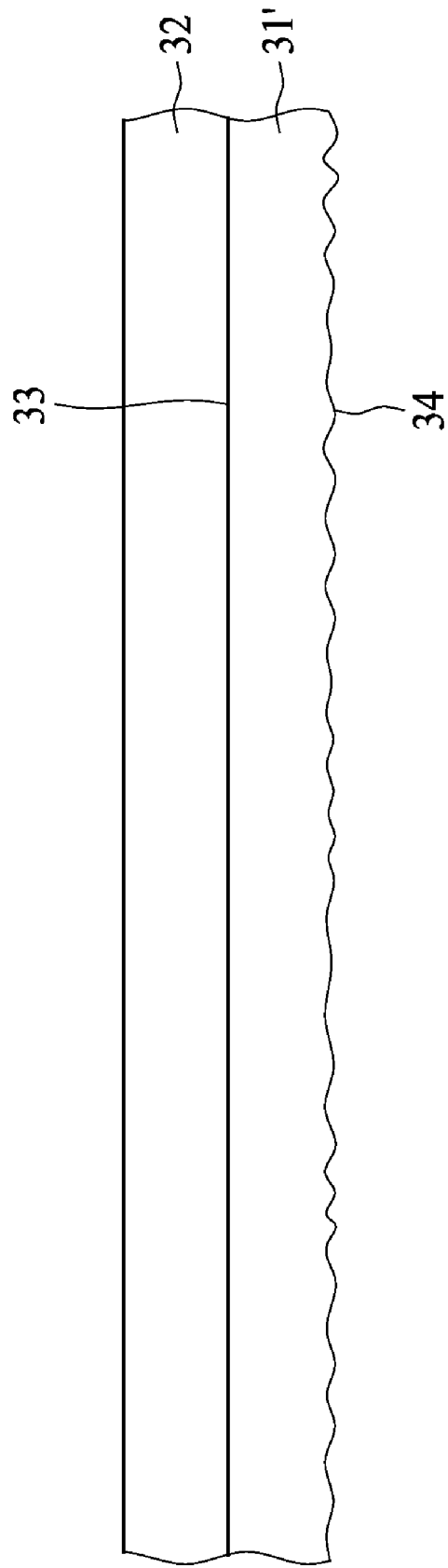
Figure 9:
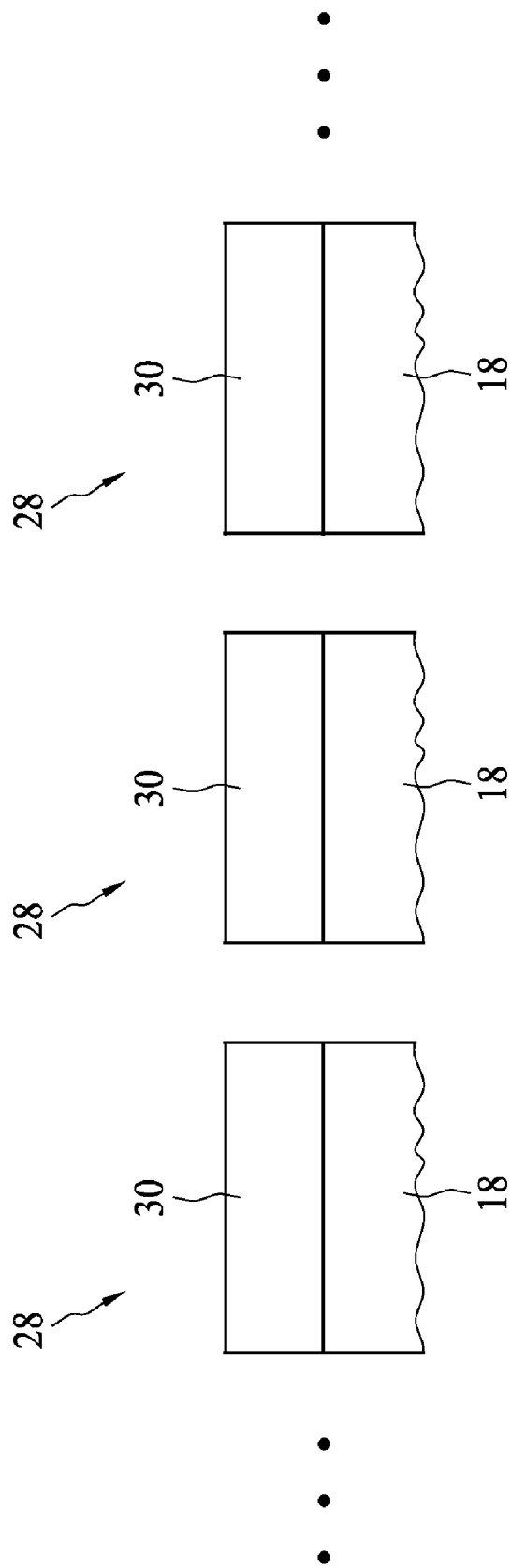

FIGS. 7 to 9 are sectional views showing the processes of a method for manufacturing heat dissipation assemblies 28 according to one embodiment of the present invention. As shown in FIG. 7, the method for manufacturing heat dissipation assemblies 28 initially provides a wafer 31. Next, a cover sheet 32 is attached to a surface 33 of the wafer 31.

Referring to FIG. 8, the wafer is then thinned to get a thinned wafer 31'. Thereafter, a surface 34 of the thinned wafer 31' is roughened or formed with a plurality of dimples using a chemical or plasma etching process.

As illustrated in FIG. 9, the combination of the thinned wafer 31' and the cover sheet 32 is diced or cut to form a plurality of heat dissipation assemblies 28.

Figure 10:
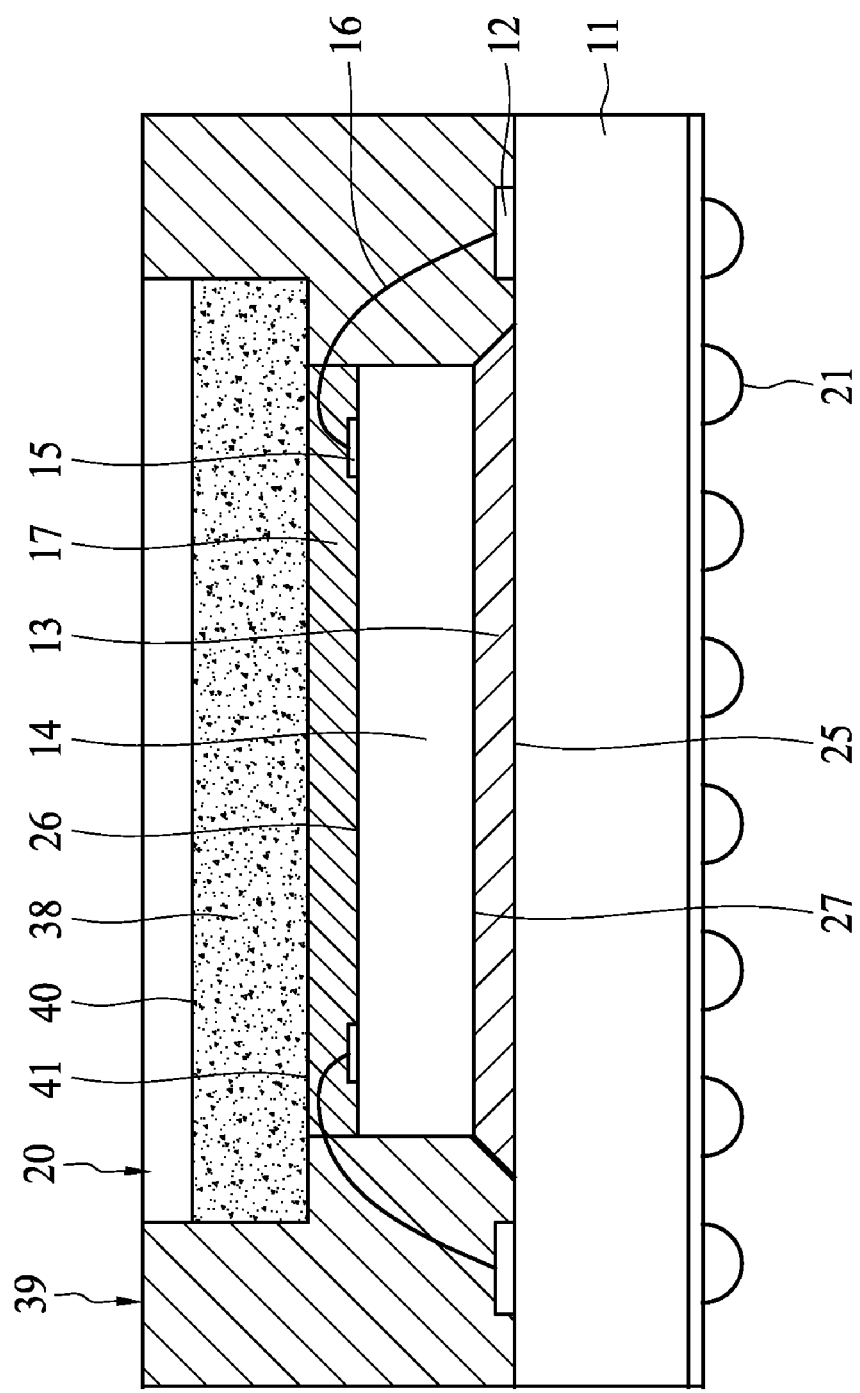
FIG. 10 is a sectional view showing a chip package device according to another embodiment of the present invention.

FIG. 10 is a sectional view showing a chip package device 3 according to another embodiment of the present invention. Referring to FIG. 10, the chip package device 3 comprises a substrate 11, a chip 14, at least one wire 16, an adhesive layer 17, a heat dissipation element 38, and an encapsulation 39. The chip 14 is attached in a manner such that its inactive surface 27 is bonded to a chip bonding area 25 of the substrate 11. Wires 16 correspondingly connect bonding pads 15 and contact pad 12 disposed peripherally about the chip bonding area 25. The adhesive layer 17 covers the active surface 26 of the chip 14, and encloses the portions of the wires 16 extending over the respective bonding pads 15. The heat dissipation element 38 is attached to and covers the adhesive layer 17. The encapsulation 39 is formed to partially enclose the peripheral region of the stacked structure including the chip 14, the adhesive layer 17, and the heat dissipation element 38, and to expose a surface 40 of the heat dissipation element 38. In the present embodiment, the major surface area of the heat dissipation element 38 is greater than the major surface area of the chip 14. The heat dissipation element 38 can be made of metal or silicon. In addition, the heat dissipation element 38 has a surface 41 for attachment to the adhesive layer 17 and a surface 41 opposite the surface 40, wherein the surface 41 can be rougher than the surface 40 for increasing adhesion strength between the heat dissipation element 38 and the adhesive layer 17.

The encapsulation 39 partially encloses the periphery of the chip 14, the adhesive layer 17, and the heat dissipation element 38. An indented opening 20 can be formed on the encapsulation 39, wherein the opening 20 exposes the entire surface 40 of the heat dissipation element 38.

A plurality of solder balls 21 can further be formed on the substrate 11. The plurality of solder balls 21 and the chip 14 can be disposed oppositely. Through the plurality of solder balls 21, the chip 14 can electrically connect a device or circuit outside the chip package device 3.

In summary, the present invention can be embodied as a chip package device comprising a heat dissipation element. The heat dissipation element is sufficiently exposed outside of the chip package device; thus, the chip package device has good heat dissipation efficiency. In addition, the chip package device further comprises an adhesive layer partially enclosing wires connecting the chip and the substrate in the chip package device. The present invention also proposes a method for manufacturing a chip package device. The method uses a cover element covering a heat dissipation element. An encapsulation is then formed peripherally about a chip, an adhesive layer, the heat dissipation element, and the cover element. As such, a package having an exposed heat dissipation element can be easily fabricated after the cover element is removed, and the heat dissipation element need not be cut.

The above-described embodiments of the present invention are intended to be illustrative only. Numerous alternative embodiments may be devised by persons skilled in the art without departing from the scope of the following claims.

What is claimed is:

1. A chip package device, comprising:
a substrate including at least one chip bonding area and at least one contact pad disposed peripherally on the at least one chip bonding area;
a chip including an active surface, an inactive surface, and at least one bonding pad disposed on the active surface, wherein the chip is disposed on the at least one chip bonding area of the substrate with its inactive surface facing the substrate;
at least one wire connecting the at least one bonding pad and the at least one contact pad;
an adhesive layer covering the active surface of the chip and enclosing a portion of the at least one wire extending over the at least one bonding pad;
a heat dissipation element attached to the adhesive layer, covering the chip; and
an encapsulation partially enclosing a periphery of an assembly including the chip, the adhesive layer, and the heat dissipation element, the encapsulation including an indented opening to expose a surface of the heat dissipation element;
wherein a surface of the heat dissipation element attached to the adhesive layer is rougher than the surface exposed through the indented opening.

2. The chip package device of claim 1, wherein the adhesive layer comprises film over wire material.

3. The chip package device of claim 1, wherein a major surface area of the heat dissipation element is larger than a major surface area of the chip.

4. The chip package device of claim 1, wherein a major surface area of the heat dissipation element is equal to a major surface area of the chip.

5. The chip package device of claim 1, wherein the indented opening of the encapsulation has a dimension equal to that of the heat dissipation element.

6. The chip package device of claim 1, wherein the at least one wire includes two end portions, wherein one end portion is in the encapsulation and another end portion is in the adhesive layer.

7. A manufacturing method of a chip package device, comprising the steps of:
providing a substrate including at least one chip bonding area and at least one contact pad;
providing at least one chip including an active surface, an inactive surface, and at least one bonding pad disposed on the active surface, wherein the at least one chip is disposed on the at least one chip bonding area of the substrate with its inactive surface facing the substrate;
connecting the at least one bonding pad and the at least one contact pad using a wire;
applying an adhesive layer to cover the active surface of the at least one chip and enclosing a portion of the wire extending over the at least one bonding pad;
attaching a heat dissipation assembly, including a heat dissipation element and a cover element, to the adhesive layer, wherein the heat dissipation element is between the cover element and the at least one chip;
forming an encapsulation to enclose a periphery of a heat dissipation assembly including the chip, the adhesive layer, and the heat dissipation element, the encapsulation including a top exposing the cover element; and
removing the cover element.

8. The manufacturing method of claim 7, wherein the heat dissipation element is comprised of silicon, and the manufacturing method further comprises the steps of:
attaching a cover sheet to a wafer, wherein the cover sheet covers a surface of the wafer;
thinning the wafer; and
cutting the cover sheet and the wafer to obtain a plurality of the heat dissipation assemblies.

9. The manufacturing method of claim 7, wherein the step of removing the cover element comprises a step of removing the cover element by heating, or peeling off the cover element.

10. The manufacturing method of claim 7, further comprising a step of forming an opening on the top of the encapsulation to expose a surface of the heat dissipation element.

11. The manufacturing method of claim 7, wherein the adhesive layer comprises film over wire material.

12. The manufacturing method of claim 7, wherein the heat dissipation element is comprised of metal.

13. The manufacturing method of claim 7, wherein a major surface area of the heat dissipation element is larger than a major surface area of the chip.

14. The manufacturing method of claim 7, wherein a major surface area of the heat dissipation element is equal to a major surface area of the chip.

15. The manufacturing method of claim 7, wherein the cover element has a dimension equal to that of the heat dissipation element.

16. The manufacturing method of claim 7, wherein the wire includes two end portions, wherein one end portion is in the encapsulation and another end portion is in the adhesive layer.

17. The manufacturing method of claim 8, further comprising a step of roughening another surface of the wafer uncovered by the cover sheet.

* * * * *